United States Patent [19]

Nissim et al.

[11] Patent Number: 5,534,444
[45] Date of Patent: Jul. 9, 1996

[54] PROCESS FOR PRODUCING AN ELECTRICALLY CONTROLLABLE MATRIX OF VERTICALLY STRUCTURED QUANTUM WELL COMPONENTS

[75] Inventors: Yves Nissim, Paris; Marcel Bensoussan, Boulogne, both of France

[73] Assignee: France Telecom, Paris, France

[21] Appl. No.: 493,786

[22] Filed: Jun. 22, 1995

[30] Foreign Application Priority Data

Jun. 22, 1994 [FR] France .................................. 94 07640

[51] Int. Cl.[6] .................................................. H01L 21/20
[52] U.S. Cl. ............................... 437/5; 437/110; 437/127; 437/129; 437/133
[58] Field of Search ............................... 437/5, 127, 129, 437/133, 110

[56] References Cited

U.S. PATENT DOCUMENTS

| | | | |
|---|---|---|---|
| 4,883,769 | 11/1989 | Au Coin et al. | 437/113 |
| 4,957,879 | 9/1990 | Omura et al. | 437/129 |
| 4,983,540 | 1/1991 | Yamaguchi et al. | 437/110 |
| 5,192,709 | 3/1993 | Petroff | 437/129 |
| 5,272,105 | 12/1993 | Yacobi et al. | 437/133 |
| 5,376,583 | 12/1994 | Northrup et al. | 437/133 |
| 5,411,895 | 5/1995 | Hsu | 437/5 |

FOREIGN PATENT DOCUMENTS

| | | | |
|---|---|---|---|
| 222216 | 10/1986 | Japan | 437/110 |
| 33380 | 5/1990 | Japan . | |
| 103186 | 8/1990 | Japan . | |
| 66174 | 3/1991 | Japan | 437/110 |

OTHER PUBLICATIONS

Applied Physics Letters, vol. 49, No. 9, 1 Sep. 1986, New York, pp. 510–512.
Applied Physics Letters, vol. 60, No. 5, 3 Feb. 1992, New York, pp. 607–609.
Proceedings Of The Royal Microscopical Society Conference, Proceedings Of Microscopy Of Semiconducting Materials, No. 134, 5 Apr. 1993, Oxford, pp. 459–462.

*Primary Examiner*—R. Bruce Breneman
*Assistant Examiner*—Linda J. Fleck
*Attorney, Agent, or Firm*—Blakely, Sokoloff, Taylor & Zafman

[57] ABSTRACT

This invention relates to a process for producing an electrically controllable matrix of vertically-structured quantum well components from a substrate on which a lower Bragg mirror has been "epitaxiated", which said mirror is made up of one or several alternations of semiconductor thin layers surmounted by an active layer consisting of compound III/V-based quantum well heterostructures, characterized in that:

a) the active quantum well layer is encapsulated with a dielectric layer capable of inducing an alloy interdiffusion in the quantum well layer, b) the said dielectric layer (3) is etched in such a way as to create a self-alignment mask (4), c) the substrate covered by the self-alignment mask is treated thermally so as to create modified regions (7) by alloy interdiffusion in the active layer, d) an upper mirror (8), in semiconductor material doped inversely to the lower mirror, is deposited by epitaxial growth in the recesses of the mask with regard to the regions of the non-interdiffused active zone, e) the edges of the upper mirrors in contact with the dielectric layer are metallized.

8 Claims, 3 Drawing Sheets

PROCESS FOR PRODUCING AN ELECTRICALLY CONTROLLABLE MATRIX OF VERTICALLY STRUCTURED QUANTUM WELL COMPONENTS

This invention relates to a process for producing an electrically controllable matrix of vertically-structured quantum well components from a substrate on which a lower Bragg mirror has been "epitaxiated", which said mirror is made up of one or several alternations of semiconductor thin layers surmounted by an active layer consisting of compound III/V-based quantum well heterostructures.

The exploitation of parallelism as a means of increasing the rate in optical signal treatment is largely a question of implementing devices, such as surface emission lasers, modulators and optical bistables, made up of vertically-structured quantum well components in the form of matrixes. The manufacture of this kind of matrix and its monolithic integration in micro-optoelectronics involves the need to be able to vary, in the same plane, the properties of the material so as to produce locally either optical confinement, or electronic confinement, or optical absorption, or a combination of all three. In addition, metallic contacts must be introduced in these vertical structures in order to excite the active zone of the component.

The possibilities for "epitaxiated" thin layer growth offered by modern techniques have without doubt broadened the scope in engineering quantum well structures for semiconductor devices in micro-optoelectronics. Mastery of growth techniques has now reached a point where it is possible to control a thin layer growth to the nearest atomic monolayer. Quantum wells of high quality are thus obtained with very abrupt interfaces where, thanks merely to a geometric parameter (well thickness and/or insertion in the well of an atomic plane different from the matrix during growth), it is possible to produce, in the same family of material (same growth base, same cells, same conditions of growth), the property required (forbidden band, oscillator strength, etc.) for the desired application. However, this engineering provides access only to 2D (two-dimensional) properties, i.e. to quantification properties along the growth axis.

The matrixing of micro-optoelectronic components from these heterostructures consists of shaping the structure laterally. This is usually obtained by a succession of technological stages depending on the component which it is wished to produce: masking, etching, epitaxy recovery, passivation, etc. These technologies apply to vertically-structured components where it is a question of putting in close contact fairly similar materials (possessing nonetheless differentiated electrical and optical properties) in order to carry out a vertical electrical and optical confinement.

The individual virtually-structured component is made up of a vertical cavity (perpendicular to the plane of the sample surface) constituted by an active layer lying between two Bragg mirrors (lower and upper). The active layer contains quantum wells produced by an alternation of semiconductor composite materials. The mirrors possess a very high degree of reflectivity and are constituted of alternations of semiconductor layers whose thickness is determined by the working wavelength of the component according to Bragg conditions (Bragg mirror). Charge carriers are injected electrically into the active zone of this component. The structures are, for example, of PIN type: P (upper mirror), I (cavity), N (lower mirror). In order to obtain an electric control on this kind of structure, the lower and upper mirror must be contacted separately. The contact on the lower mirror is made across the substrate (the back side of the substrate is earthed). Contact is now ensured if the substrate is of the same type as the lower mirror. In the case treated herein, the substrate will be of type n. The upper mirror will be individually metallized for each pixel. The insulating side of the cavity allows insulation between the two contacts.

The doping of each of the regions is thus considerable and is determined during the growth of the structure. These components are produced in matrix form and may be either surface emission lasers, or amplifiers, or modulators or bistable optical gates, or any juxtaposition or superposition of devices of this type, all evacuated electrically.

There are at present two techniques for making matrixes of vertically-structured components (pixels) which may be controlled electrically:

The pixel matrix may be produced by lithography and reactive ionic etching. In this case, the implementation is lengthy (ionic etching at a depth of several microns of a material constituted of several layers of different type), the structure is no longer planar, and lastly the pixel sides require a passivation which has yet to be mastered.

The pixel matrix may be obtained by disordered alloy induced by ion implantation according to B. G. Sfez et al, Appl. Phy. Lett. 60, 607, 1992. In this case, manufacturing is costly (implanter). Moreover, it is necessary to use a complementary system to locate the pixels (e.g. luminescent cartography), because the implantation mask defining the position of the pixels has to be removed before proceeding to the next technological stages.

Finally, the ionic implantation technique introduces structural defects and impurities into the implanted regions, which said defects and impurities are detrimental to the preservation of the optical properties of the structures.

The techniques for manufacturing these structures are thus very complex at the present time, a fact which weighs heavily in the cost of the final device. The invention of reliable and reproducible technological processes on a large scale is crucial for the industrial development of these matrixes.

The purpose of this patent is to provide a simple, versatile implementation method, allowing a monolithic integration in matrix form of vertically-structured components, in self-aligned fashion, leading to a reduction in the number of stages in producing electrically controllable vertical structures.

The process according to the invention makes it possible to produce an electrically controllable matrix of vertically-structured quantum well components from a doped substrate n (or p) on which is "epitaxiated" a doped n (or p) lower Bragg mirror made up of one or several alternations of semiconductor thin layers surmounted (again by epitaxy) by an active layer composed of non-doped quantum well heterostructures, characterized in that:

a) the active quantum well layer is encapsulated with a dielectric layer capable of inducing an alloy interdiffusion in the said quantum well layer, b) the said dielectric layer is etched in such a way as to create a self-alignment mask demarcating recesses with respect to the non-covered regions (which are left intact) of the active layer, c) the substrate covered by the self-alignment mask is treated thermally so as to create in the active layer, by alloy interdiffusion, vertically-divided regions whose composition is modified in relation to the original state (interpixel regions) and also to create non-modified regions (pixels) in matrix form, d) an upper mirror in semiconductor material doped inversely to the lower mirror (doped p in the example under consideration), is deposited by selective epitaxy recovery in the recesses of the mask with respect to the non-modified regions (pixels), e) the edges of the upper mirrors are metallized so as to leave an opening at the center of the mirror of each pixel for the pixel inputs and outputs.

The process according to the invention thus uses a dielectric layer as a means of causing alloy interdiffusion but also as a self-alignment mask for a selective local epitaxy recovery.

This dielectric layer also acts as a metallizing insulator for the contact of the upper mirror of each pixel and thus determines the place for injection of the charge carriers.

The wafer covered with the self-alignment mask is produced by depositing, on the quantum well active layer, a dielectric encapsulant capable of inducing par interdiffusion a composition modification perpendicular to the substrate in the quantum well heterostructures after annealing.

These techniques using alloy interdiffusion have already been described in a special issue devoted to quantum well mixing for optoelectronics of "Optical and Quantum Electronic", vol. 23 (1991), by D. G. Deppe et al. "Strippe-Geometry Quantum Well Heterostructure AlGaAs Lasers Defined by Defect Diffusion", Appl. Phys. Lett. 49, 510, 1986, and by L. J. Guido et al. "Effects of Dielectric Encapsulation and As Overpressure on AlGa Interdiffusion in AlGaAs-GaAs Quantum Well Heterostructures", J. of Appl. Phys., 61, 1327, 1987.

Compared to the prior art, the process for producing an electrically controllable matrix makes it possible to use the dielectric encapsulant not only to produce three-dimensional patterns through the implementation of localized alloy interdiffusion, but also to use the said encapsulant as a self-alignment mask for a selective local epitaxy of the upper mirror, and as a metallizing insulator for the electric contact plug on the upper mirror.

It is possible to vary the degree of alloy mixing introduced by the interdiffusion induced by a given encapsulant. This variation of the degree of mixing is obtained by controlling the constitution of the layer and/or by controlling the mechanical tension induced by the dielectric film on the active layer, this last parameter being itself controlled by the thickness or the composition of the encapsulant. The materials capable of performing this modification are described in Patent FR-B-2 605 647.

The experimental conditions for the deposition and the thickness of this layer are pre-determined so as to take into account the experimental conditions of epitaxy recovery. In particular, care shall be exercised to ensure that the stoichiometry and the density of the layer permit good mechanical and chemical behavior during epitaxy recovery. The epitaxy conditions are generally exposure to hydrides and organometals at very high temperatures ($\geq 700°$ C.). The thickness of the insulator must be calculated so as to be in excess of or equal to the thickness of the semiconductor mirror, thereby preserving insulation over the entire top of the pixel. The deposition conditions shall be such as to ensure that the encapsulant is the best insulator possible, i.e. that its resistivity is maximized.

The expression "negative layer" is understood to mean a dielectric thin layer which is deposited on the quantum well heterostructure and which causes a modification in the composition of this structure after annealing at depths of several microns. The layer might be of type SiO or possibly $SiO_xN_y$, Y being small enough to enable the $SiO_xN_y$—based layer to behave as a negative layer.

According to an advantageous variation, the dielectric encapsulant is SiO—based.

The encapsulant is then etched by lithography and RIE in order to determine, under matrix form, recesses with regard to regions which are not to be modified. The wafer thus covered with the self-alignment mask is then treated thermally in order to transfer the pattern deep into the active layer by means of the alloy interdiffusion phenomenon.

The substrate covered with the self-alignment mask is treated thermally in order to create, by alloy interdiffusion, distribution regions of composition perpendicular to the substrate, different according to the mask design, thereby generating a pixel matrix whose active layer is not interdiffused.

Thermal treatment of the etched wafer consists in submitting the wafer to a given annealing temperature over a determined period, calculated in function of the energy shift of the forbidden band which is desired between interdiffused zone and virgin zone (typically $850°$ C. over a period of time of up to 4 hours).

The two annealing types used are respectively rapid annealing by halogen lamp and conventional annealing in a standard oven. Fast annealing is characterized by very short temperature-rise times, with a temperature of $850°$ C. being reached in approximately 10 seconds (i.e. about $100°$ C./sec), and by thermal treatment temperature stages ranging from 0 to a score or so of seconds. Temperature-rise times for conventional annealing are of the order of 5 minutes with stages ranging from 0 to several scores of minutes.

The annealing stage is usually carried out at approximately $850°$ C.

Localized and selective epitaxy recovery in the openings defined in the previous stage is carried out in the usual way. However, care will be taken to avoid direction faceting (111) so as to produce pixel sizes which are sufficiently small ($\leq 1$ μm) and especially so as to respect the size of the non-interdiffused zone defined in the substrate.

Doping of the upper mirror is determined during the deposition. It is performed by introducing an element (or dopant), e.g. carbon or beryllium. It should be noted that the structure is self-aligned. It is possible to perform doping after the event (after epitaxy) by implanting the same element.

The invention applies generally to all quantum well heterostructures based on GaAs or InP-based binary, ternary or quaternary III/V materials.

The invention also applies to quantum well thin layers.

Among these suitable heterostructures in the context of this invention, mention may be made of the alternations of layers formed from the structure $GaAs/Ga_{1-x}Al_xAs$ with $0 \leq x \leq 1$. But the process may be extended to other heterostructure types ($GaAs/Ga_{1-x}In_xAs$ with $0 \leq x \leq 1$).

The following heterostructures may, for example, be cited for the active zone of the vertical structure: 130 periods of $GaAs/Ga_{0.7}Al_{0.3}As$ of 10 nm of thickness for each layer.

In the case of the mirror, 14 periods of $AlAs/Al_{0.1}Ga_{0.9}As$ may be used.

The edges of the upper mirrors are metallized by using the dielectric layer as contact insulator in relation to the neighboring pixel.

Other characteristics and advantages of this process will become apparent from the following description. This description is given by way of example and is in no way restrictive. It is to be read in conjunction with the attached drawings in which:

FIGS. 1 to 1c and 2 are perspective views and FIGS. 3a, 3b, 4a to 4c are cross sections.

FIGS. 1a to 1c provide a general illustration of the implementation of the process in conformity with the invention up to epitaxy recovery (stage b).

Figure 1A:
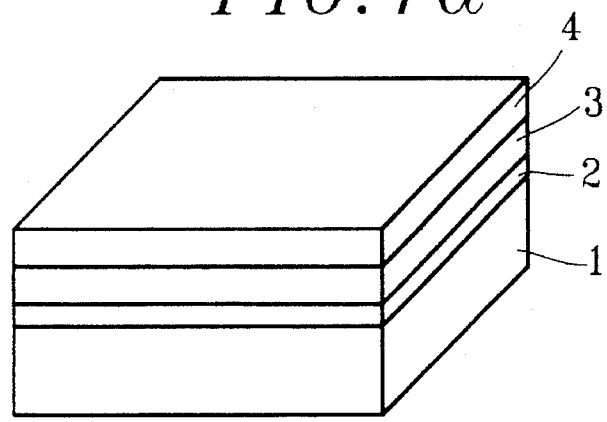
Figure 1B:
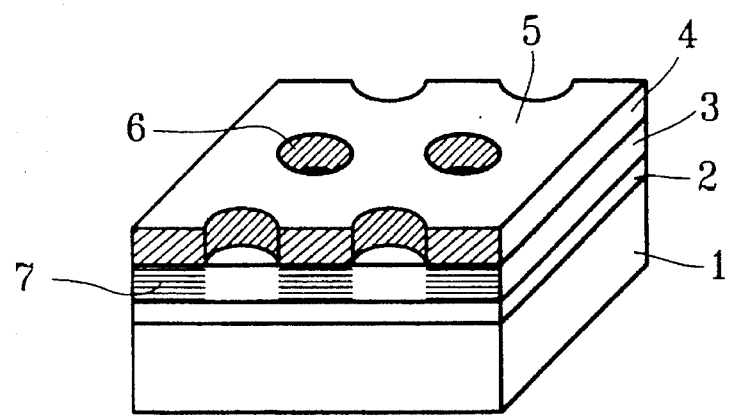
Figure 1C:
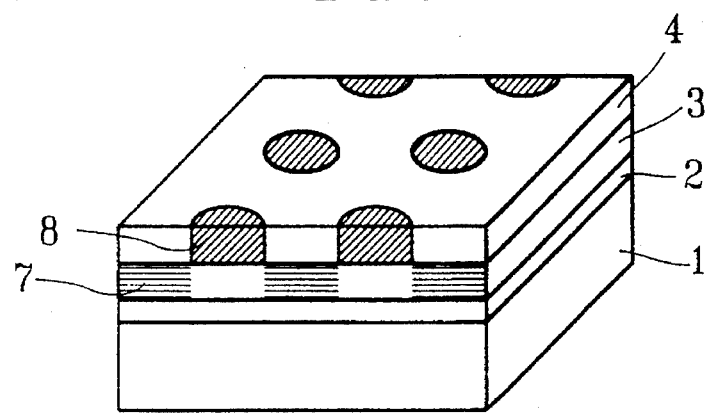

In FIGS. 1a to 1c, 1 refers to the doped substrate n of such a heterostructure, 2 refers to the doped lower mirror n and 3 refers to the intrinsic active zone constituted by quantum wells.

Once the growth of the lower mirror and quantum well layers (2, 3) on the substrate 1 has been obtained by standard techniques (FIG. 1a), a layer 4 in a dielectric material is deposited on the quantum well layers.

In accordance with the invention, the conditions of deposition and the thickness of this layer are predetermined in order to take into account experimental conditions of epitaxy recovery (temperature, hydride and organometal levels). Moreover, the thickness of the insulator must be calculated so as to maintain insulation along the whole of the top of the pixel. Particular care must be taken to ensure that the conditions of encapsulant deposition are such as to maximize the interpixel electric insulation provided by this layer.

The deposit is, for example, a chemical deposit in vapor phase assisted by rapid-therm. The desired deposit geometries may be obtained by standard photolithographic and etching techniques.

The dielectric layer is etched by lithography and RIE in order to constitute a mask 5 demarcating recesses 6.

Once the deposit has been produced and the mask etched, the sample thus obtained is treated thermally by being submitted to a given annealing temperature, over a determined period, in order to create the alloy disorder 7 in the regions of the active zone 3 with respect to the mask 5.

The two annealing types used are respectively rapid annealing by halogen lamp and conventional annealing in a standard oven. Fast annealing is characterized by very short temperature-rise times, with a temperature of 850° C. being reached in approximately 10 seconds (i.e. about 100° C./sec), and by thermal treatment temperature stages ranging from 0 to a score or so of seconds. Temperature-rise times for conventional annealing are of the order of 5 minutes with stages ranging from 0 to several scores of minutes.

The dielectric material of the layer 4 is advantageously SiO.

The recesses 6 demarcated by the geometry of the self-alignment mask are filled by standard epitaxy recovery to produce pixels 8 which constitute the upper mirror in semiconductor materials. Provision is made for the doping p of this upper mirror during growth.

Figure 2:
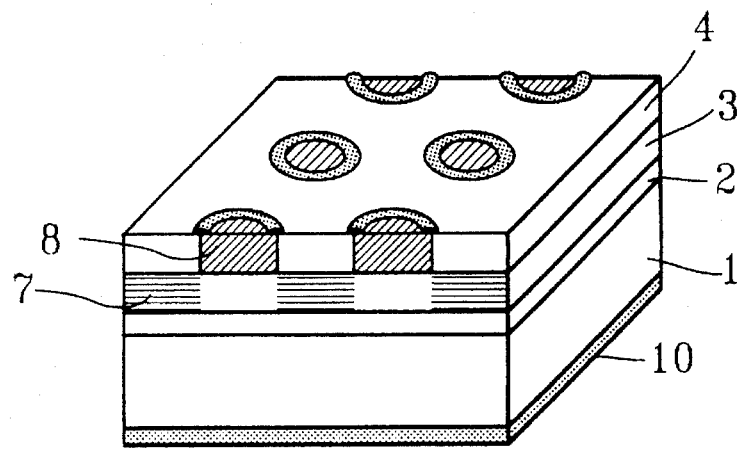
FIG. 2 illustrates a first variation of the process according to the invention.

If necessary, self-aligned ion implantation is carried out in this mirror in order to define superdoping regions for the purposes of obtaining ohmic contact. A metallizing ring 9 is placed around each pixel, the insulator ensuring interpixel insulation (FIG. 2), and a rear contact layer 10 is deposited on the free surface of the substrate 1.

Figure 3A:
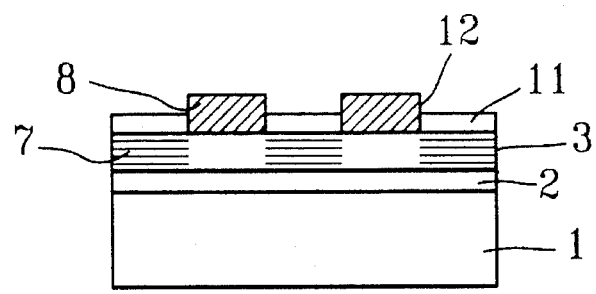
FIGS. 3a and 3b illustrate a second variation of the process according to the invention.
Figure 3B:
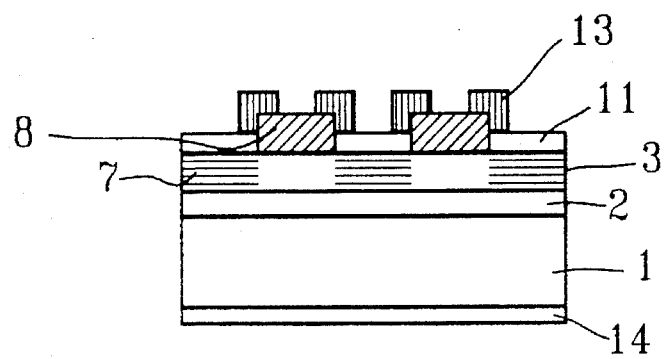

According to FIG. 3a, the dielectric layer 11 has been removed over a large part by chemical selective etching (HF solution) of the dielectric so as to leave only a fine insulating thickness uncovering the lateral edges of the upper mirror 12 of the pixels. The next step is the metallization 13 of the upper edges of the pixels thus uncovered, with the dielectric still ensuring interpixel insulation, and the deposit of a rear contact layer 14 (FIG. 3b).

Figure 4A:
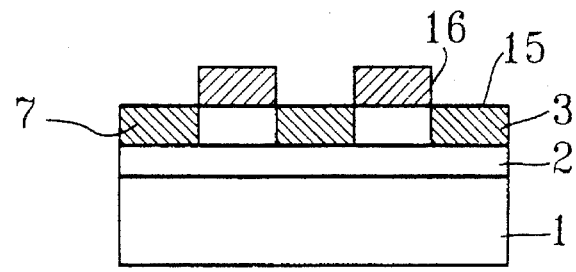
FIGS. 4a to 4c illustrate a third variation of the process according to the invention.

According to FIG. 4a, the dielectric has been entirely removed by selective chemical attack, thus uncovering the upper side 15 of each region 7 of the active zone where an alloy disorder has been induced, as well as the edges 16 of the pixels.

Figure 4B:
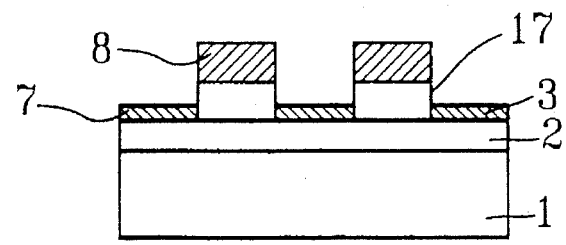
Figure 4C:
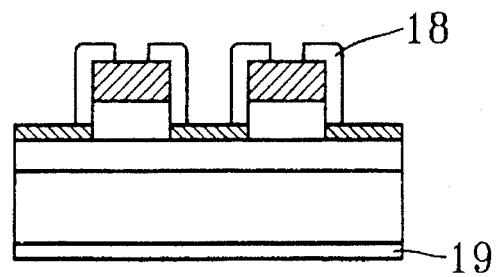

The interpixel region and the upper mirror are lightly etched by RIE to a thickness of a few 1000 Å, care being taken during growth to leave a buffer zone of an equivalent thickness on the mirror (FIG. 4b). The next step is the metallization 18 of the upper contacts (lithography, metal deposit, lift off), making it possible to contact the edges of the upper mirror and of the active zone, and the deposit of a rear contact layer 19 (FIG. 4c).

We claim:

1. A process for producing an electrically controllable matrix of vertically-structured quantum well components from a doped n (or p) substrate (1) on which has been deposited, by epitaxy, a doped n (or p) lower mirror (2) composed of one or several alternations of semiconductor thin layers surmounted by an active "epitaxiated" layer (3) made up of quantum well heterostructures, characterized in that:

a) the active quantum well layer is encapsulated with a dielectric layer (4) capable of inducing an alloy interdiffusion in the said quantum well layer, b) the said dielectric layer (4) is etched in such a way as to create a self-alignment mask (5) demarcating recesses (6) with respect to the non-covered regions (which are left intact) of the active layer, c) the substrate covered by the self-alignment mask is treated thermally so as to create in the active layer, by alloy interdiffusion, vertically-divided regions (7) whose composition is modified in relation to the original state (interpixel regions), and also to create non-modified regions (pixels) in matrix form, d) an upper mirror (8) in doped p (or n) semiconductor material inversely to the lower mirror, is deposited by "epitaxiated" growth in the recesses of the mask, e) the edges of the upper mirrors in contact with the dielectric layer are metallized so as to leave an opening at the center of the mirror of each pixel for the optical inputs and outputs of the pixel.

2. A process according to claim 1, characterized in that the intrinsic quantum well active zone is of type GaAs/GaAlAs or GaAs/GaInAs or InP/InGaAs/InGaAsP.

3. A process according to claim 1, characterized in that the dielectric mask is SiO-based.

4. A process according to one of claims 1 to 3, characterized in that the upper mirrors are superdoped by ion implantation in order to ensure ohmic contact.

5. A process according to claim 1, characterized in that the thickness of the dielectric mask is at least equal to the thickness of the upper mirrors.

6. A process according to claim 1, characterized in that the contacts of the upper mirror are deposited in a ring around the pixel so as to use the dielectric mask as interpixel insulator.

7. A process according to claim 1, characterized in that, before metallizing, a substantial part of the thickness of the dielectric mask is removed and the metallic layer is deposited on the uncovered edges and sides of the upper mirrors, the remaining dielectric layer ensuring interpixel electric insulation.

8. A process according to claim 1, characterized in that, before metallizing, the dielectric mask and a part of the interpixel interdiffused layers are removed and the metallic layer is deposited on the edges and sides of the upper mirrors, the remaining interdiffused (non pixelised) regions ensuring interpixel electric insulation.

* * * * *